United States Patent [19]
Ishii

[11] Patent Number: 5,892,407
[45] Date of Patent: Apr. 6, 1999

[54] PHASE-LOCKED LOOP SYNTHESIZER

[75] Inventor: Katsuhiro Ishii, Tokyo, Japan

[73] Assignee: NEC Corporation, Tokyo, Japan

[21] Appl. No.: 816,417

[22] Filed: Mar. 14, 1997

[30] Foreign Application Priority Data

Mar. 14, 1996 [JP] Japan ................................. 8-057309

[51] Int. Cl.⁶ .......................... H03L 7/08; H03K 5/159
[52] U.S. Cl. ..................... 331/17; 331/1 R; 331/DIG. 2; 327/156; 327/159
[58] Field of Search ............................. 331/17, 1 A, 1 R, 331/DIG. 2; 327/156, 157, 148, 159

[56] References Cited

U.S. PATENT DOCUMENTS

| | | | |
|---|---|---|---|
| 5,337,335 | 8/1994 | Cloetens et al. | 331/17 |
| 5,552,727 | 9/1996 | Nakao | 327/156 |
| 5,572,157 | 11/1996 | Takashi et al. | 327/156 |
| 5,696,468 | 12/1997 | Nise | 327/156 |

FOREIGN PATENT DOCUMENTS

| | | |
|---|---|---|
| 3-103636 | 10/1991 | Japan . |
| 4-115721 | 4/1992 | Japan . |
| 4-235416 | 8/1992 | Japan . |
| 5-335944 | 12/1993 | Japan . |

*Primary Examiner*—Son T. Dinh
*Attorney, Agent, or Firm*—Young & Thompson

[57] ABSTRACT

A PLL synthesizer includes a reference oscillator, an controllable oscillator which generates an oscillation signal which varies in frequency according to a control signal, a phase comparator, and a loop filter. The loop filter includes an A/D converter, a digital filter, and a D/A converter. The digital filter removes high-frequency components from the output of the A/D converter according to setting data. The digital filter is set to a filter characteristic depending to a selected frequency of the oscillation signal. The digital output signal of the digital filter is converted to an analog signal which is used as the control signal of the controllable oscillator.

18 Claims, 4 Drawing Sheets

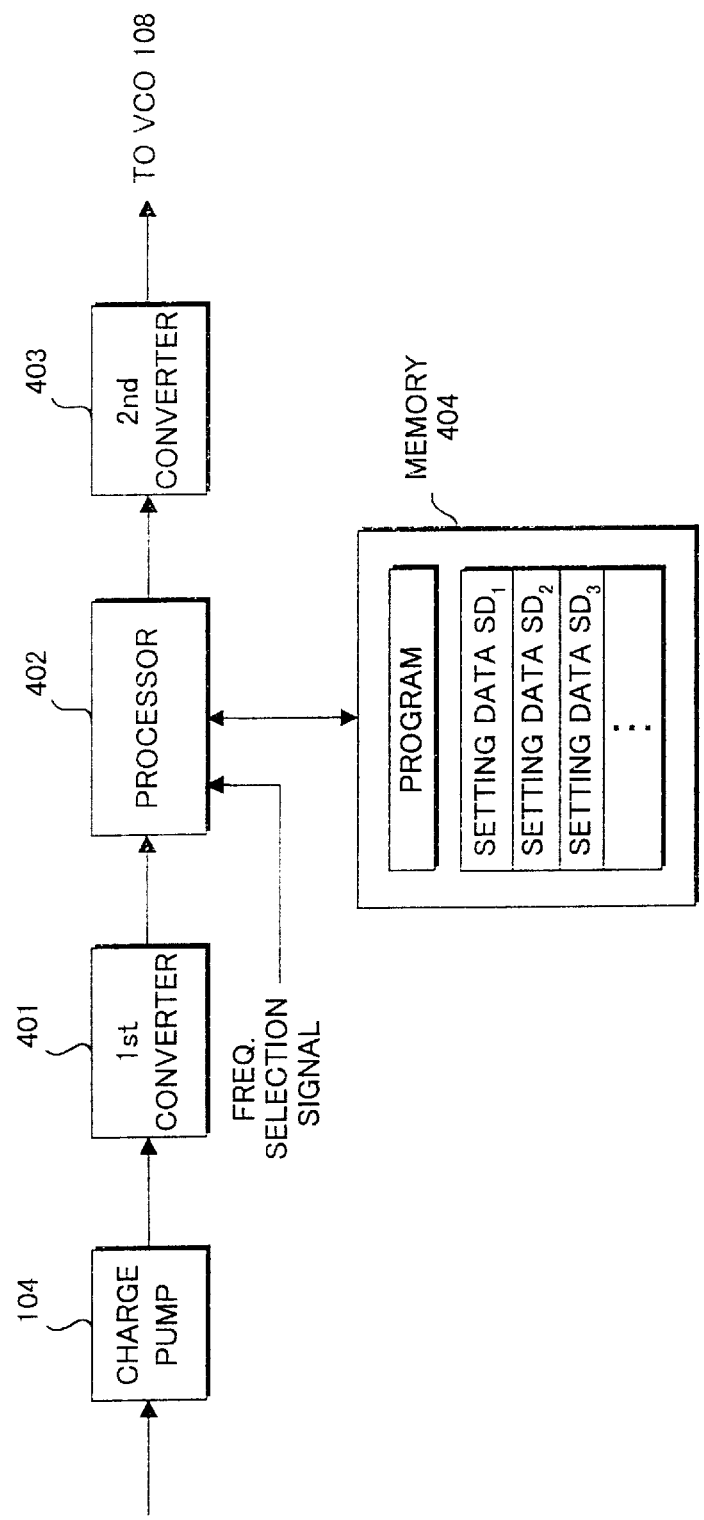

PHASE-LOCKED LOOP SYNTHESIZER

BACKGROUND OF THE INVENTION

1. Field of the Invention

The present invention generally relates to a PLL (Phase-Locked Loop) circuit and, in particular, to a PLL synthesizer which selectively generates a plurality of frequency signals.

2. Description of the Related Art

For a PLL synthesizer employed in a mobile communication terminal, it is required to selectively generate a plurality of frequencies with high speed switching and high stability. To meet such requirements, there have been proposed several circuits.

A PLL synthesizer disclosed in Japanese Patent Unexamined Publication No. 5-335944 is provided with a plurality of low-pass filters one of which is selected by a first selector and a second selector to provide a different loop gain. A selected low-pass filter receives a tuning voltage from a phase comparator through the first selector, holds the tuning voltage, and then outputs the held tuning voltage to a voltage controlled oscillator (VCO) through the second selector.

Another PLL synthesizer disclosed in Japanese Patent Unexamined Publication No. 4-235416 is provided with a plurality of low-pass filters, first and second selectors and an initial setting circuit. The first and second selectors select one of the low-pass filters providing different loop gains when switching of frequencies. Just after the switching occurs, the initial setting circuit adjusts the phase of a variable-divided output of the VCO for synchronization with that of a reference signal generated by a reference oscillator. This results in high speed frequency switching.

SUMMARY OF THE INVENTION

In the conventional PLL synthesizers, an analog switch is generally used as a selector to select one of the low-pass filters. However, switching of the analog switch causes a spike or an instantaneous variation of current and voltage which may adversely influence on the PLL operation.

Further, the internal resistance of the analog switch influences the PLL response. Even if ideal switches were used, a plurality of interconnection lines are necessary for connecting the low-pass filters to the selector. This causes an increased number of noise-sensitive circuits to which attention should be paid. In other words, it is no exaggeration to say that the PLL response of filter-selective configuration as described above is poorer than that of single-filter configuration.

Furthermore, the conventional PLL synthesizers need a plurality of low-pass filters so as to cope with frequency switching. Therefore, it is very difficult to reduce the size and weight of the PLL synthesizer.

An object of the present invention is to provide a PLL circuit which selectively generates a plurality of frequencies without influence upon PLL performance.

Another object of the present invention is to provide a PLL synthesizer which can cope with a plurality of frequency channels with the reduced amount of hardware.

Still another object of the present invention is to provide a PLL synthesizer having a single loop and a plurality of selectable PLL characteristics.

According to the present invention, the loop filter of a PLL circuit includes a digital filter which serves as a low-pass filter according to a given setting data. The PLL circuit includes a phase comparator, a digital filter and an controllable generator. The phase comparator compares a phase of an output signal to that of a reference signal to produce a first discrete signal corresponding to a phase difference between the output signal and the reference signal. The digital filter removes high-frequency components from the first discrete signal according to setting data to produce a second discrete signal. The controllable generator generates the output signal whose frequency is controlled based on the second discrete signal.

According to another aspect of the present invention, a phase-locked loop synthesizer includes a reference signal generator for generating a reference signal, a frequency signal generator for generating a frequency signal which varies in frequency according to a control signal, a phase comparator for comparing a phase of the frequency signal to that of the reference signal to produce a phase difference signal, and a loop filter. The loop filter is comprised of a first converter for converting the phase difference signal into a first discrete signal, a digital filter for removing high-frequency components from the first discrete signal according to setting data to produce a second discrete signal, and a second converter for converting the second discrete signal into an analog signal to output the analog signal as the control signal to the frequency signal generator.

The digital filter of the phase-locked loop circuit and synthesizer may vary in filter characteristic according to the setting data. In other words, the phase-locked loop circuit and synthesizer may be further comprised of a memory for storing setting data corresponding to a plurality of filter characteristics, and a controller for selectively reading the setting data to set the digital filter to a selected filter characteristic depending on a frequency of the output signal.

BRIEF DESCRIPTION OF THE DRAWINGS

FIG. 4 is a block diagram showing a loop filter of a PLL synthesizer according to another embodiment of the present invention.

DETAILED DESCRIPTION OF THE PREFERRED EMBODIMENTS

Figure 1:
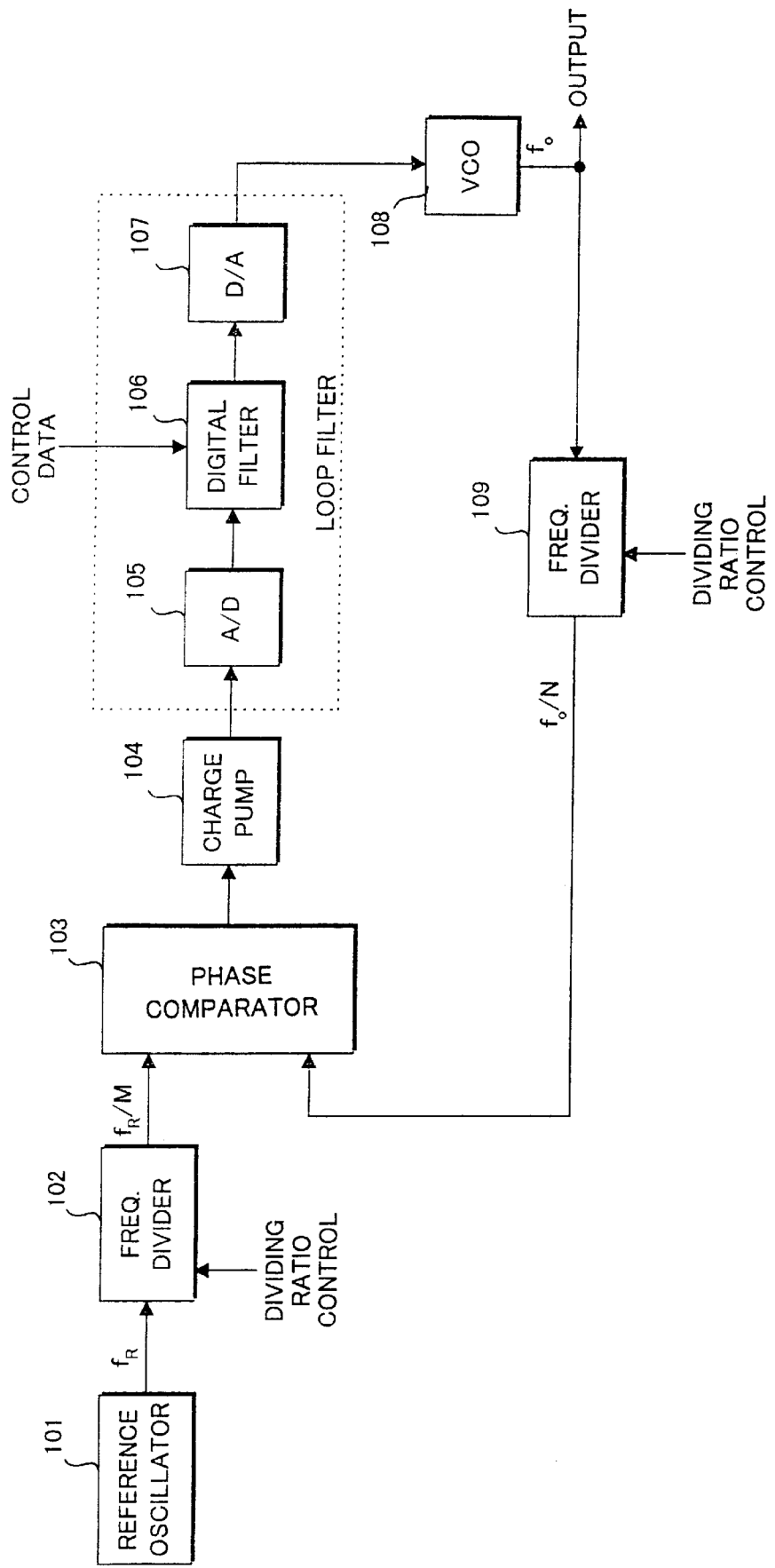
FIG. 1 is a block diagram showing a PLL synthesizer according to an embodiment of the present invention.

Referring to FIG. 1, there is shown a PLL synthesizer in accordance with an embodiment of the present invention. The PLL synthesizer is provided with a reference signal generator and a single loop circuit. The reference signal generator is comprised of a reference oscillator 101 and a frequency divider 102. The reference oscillator 101 generates a reference signal of a frequency $f_R$ and the frequency divider 102 divides the frequency $f_R$ by a controlled divisor M to produce a divided-by-M reference signal of a frequency $f_R/M$.

The single loop circuit includes a phase comparator 103, a charge pump 104, a loop filter (105–107), a voltage controlled oscillator (VCO) 108, and a frequency divider 109. The phase comparator 103 compares the phase of a feedback signal to that of the divided-by-M reference signal to produce a phase error signal whose pulse width corresponds to the difference in phase between them. Upon receiving the phase error signal, the charge pump 104 produces a bipolar phase error signal which is supplied to the loop filter.

The loop filter is comprised of an analog-to-digital (A/D) converter 105, a digital filter 106, and a digital-to-analog (D/A) converter 107. The A/D converter 105 converts the bipolar phase error signal into a discrete signal to produce a digital phase error signal which is output to the digital filter 106. In this embodiment, the digital filter 106 is set to a low-pass filter which removes high-frequency components from the digital phase error signal. The cutoff frequency of the digital filter 106 is determined according to control data received from a controller (not shown) when frequency switching occurs. The output of the digital filter 106 is converted to an analog signal which is used as a control voltage to control the oscillation frequency $f_o$ of the VCO 108. The output signal of the oscillation frequency $f_o$ is supplied to the frequency divider 109 which divides it by a controlled divisor N to output the feedback signal of $f_o/N$ to the phase comparator 103. The dividing ratio of the frequency divider 109 is controlled by the controller (not shown).

In general, a transfer function of the whole loop determines PLL characteristics including the time required for frequency switching, loop stability and signal-to-noise ratio (S/N). Especially, the PLL frequency response of the loop is largely affected by the loop filter. More specifically, to reduce the frequency switching time, the cutoff frequency of the loop filter is preferably set to a higher frequency to widen the bandwidth of the loop. Contrarily, to improve the S/N and the stability of the loop in steady state, the cutoff frequency is preferably set to a lower frequency to reduce the bandwidth of the loop.

Such a change of cutoff frequency is performed by switching the setting data of the digital filter 106. In other words, the variable bandwidth and gain of the PLL circuit is provided in a single path loop, eliminating the need of a plurality of low-pass filters which are selectively connected to the loop by the selectors. This results in considerable space saving and improved stability.

Figure 2A:
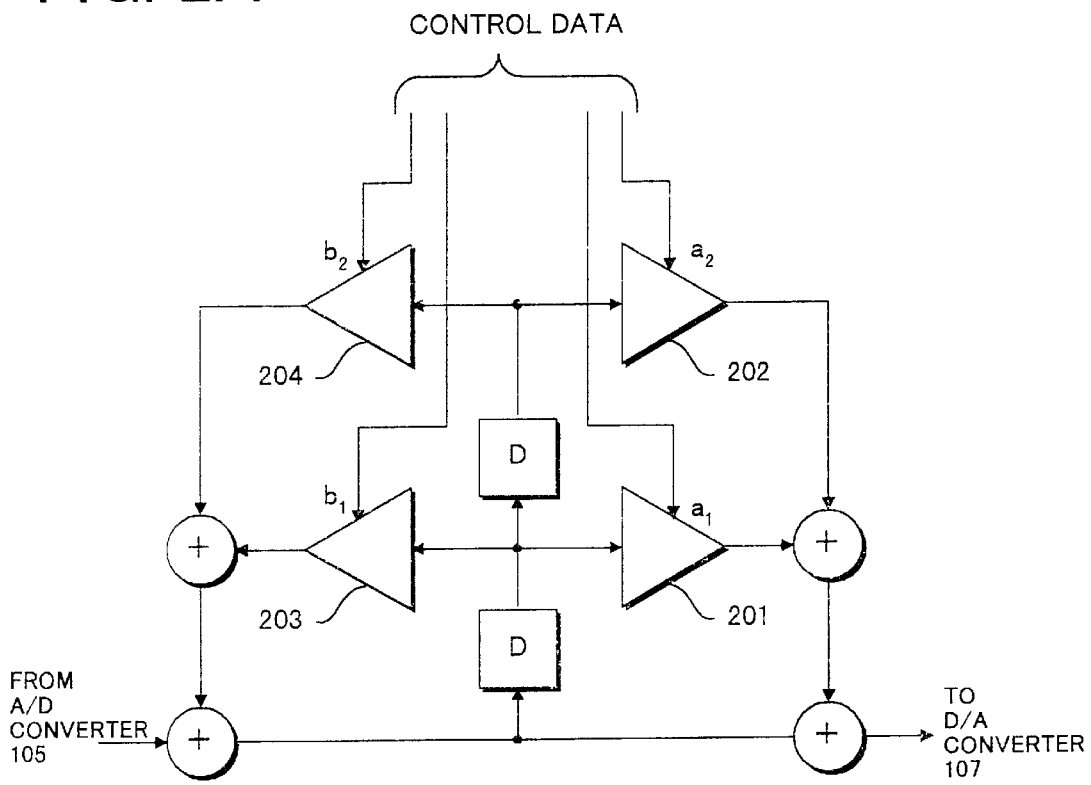
FIG. 2A is a block diagram showing an example of a digital filter used in the embodiment.

Referring to FIG. 2A, the digital filter 106 is a low-pass filter, which may be formed with a quadratic recursive filter including controllable multipliers 201–204. The respective coefficients $a_1$, $a_2$, $b_1$ and $b_2$ of the multipliers 201–204 are determined by the control data received from the controller so that the digital filter 106 has a desired characteristic of the low-pass filter. Therefore, a desired cutoff frequency and gain are obtained by the control data determining the coefficients $a_1$, $a_2$, $b_1$ and $b_2$.

Figure 2B:
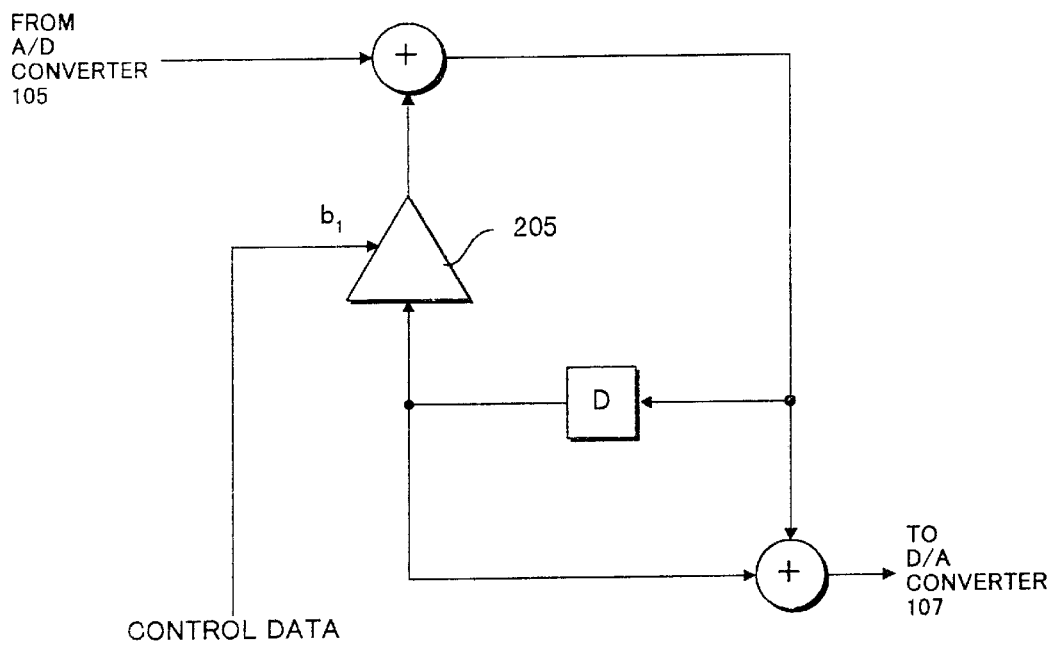
FIG. 2B is a block diagram showing another example of a digital filter used in the embodiment.

Referring to FIG. 2B, the digital filter 106 is a low-pass filter which may be formed with a simple recursive filter including a controllable multiplier 205. In this case, The coefficient $b_1$ of the multiplier 205 is determined by the control data received from the controller so that the digital filter 106 has a desired characteristic of the low-pass filter. The digital filter 106 as described in FIGS. 2A and 2B may be simply formed with wired logic circuits.

Figure 3:
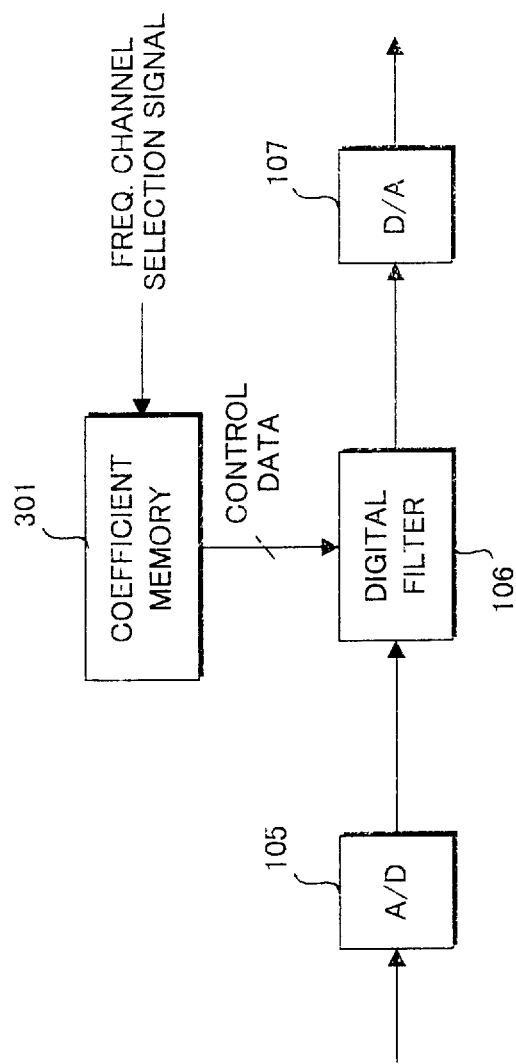
FIG. 3 is a schematic block diagram showing a coefficient controller of the digital filter used in the embodiment.

As shown in FIG. 3, in the case where the PLL synthesizer is employed in a mobile communication terminal, the control data which controls the coefficients of the digital filter 106 is read from a coefficient memory 301 according to a frequency channel selection signal. In other words, the digital filter 106 is set to a loop filter characteristic suitable for a selected oscillation frequency of the PLL synthesizer in terms of stability and high speed frequency switching.

Referring to FIG. 4, it is also possible to form the digital filter 106 with a digital signal processor running a low-pass filter program. More specifically, the loop filter is comprised of a first converter 401, a processor 402, a second converter 403, and a memory 404. The memory 404 previously stores a low-pass filter program, and a plurality of setting data $SD_1$, $SD_2$, $SD_3$ ..., $SD_K$. The processor 402 runs the low-pass filter program and then selects one of the setting data according to the frequency selection signal as described above. The first converter 401 performs sampling and digitizing of the bipolar phase error signal produced by the charge pump 104. For example, the first converter 401 measures the pulse width of the bipolar phase error signal by counting the number of clock pulses to produce the digital phase error signal. Contrarily, the second converter 403 converts the smoothened digital phase error signal into an analog signal which is output as the control voltage to the VCO 108.

What is claimed is:

1. A phase-locked loop circuit for generating an output signal from a reference signal, comprising:

a phase comparator for comparing a phase of the output signal to that of the reference signal to produce a first discrete signal corresponding to a phase difference between the output signal and the reference signal;

a digital filter for removing high-frequency components from the first discrete signal according to setting data to produce a second discrete signal;

a controllable generator for generating the output signal whose frequency is controlled based on the second discrete signal;

a memory for storing setting data corresponding to a plurality of filter characteristics; and a controller for selectively reading the setting data to set the digital filter to a selected filter characteristic depending on a frequency of the output signal.

2. The phase-locked loop circuit according to claim 1, wherein the digital filter is implemented with wired logic.

3. The phase-locked loop circuit according to claim 1, wherein the digital filter is implemented with a program-controlled processor.

4. The phase-locked loop circuit according to claim 1, wherein the setting data determines a cutoff frequency of the digital filter.

5. The phase-locked loop circuit according to claim 4, wherein the setting data determines a loop gain of the phase-locked loop circuit.

6. A phase-locked loop synthesizer comprising:

a reference signal generator for generating a reference signal;

a frequency signal generator for generating a frequency signal which varies in frequency according to a control signal;

a phase comparator for comparing a phase of the frequency signal to that of the reference signal to produce a phase difference signal;

a first converter for converting the phase difference signal into a first discrete signal;

a digital filter for removing high-frequency components from the first discrete signal according to setting data to produce a second discrete signal; and a second converter for converting the second discrete signal into an analog signal to output the analog signal as the control signal to the frequency signal generator.

7. The phase-locked loop synthesizer according to claim 6, further comprising:

a memory for storing setting data corresponding to a plurality of filter characteristics; and a controller for selectively reading the setting data to set the digital filter to a selected filter characteristic depending on a frequency of the frequency signal.

8. The phase-locked loop synthesizer according to claim 7, wherein the frequency of the frequency signal is selected from a plurality of predetermined frequencies.

9. The phase-locked loop synthesizer according to claim 8, wherein the frequency signal generator comprises:

a controllable oscillator for generating an oscillation signal which varies in frequency according to the control signal; and a frequency divider for dividing the frequency of the oscillation signal by a divisor which is selected from a plurality of predetermined divisors to produce the frequency signal.

10. The phase-locked loop synthesizer according to claim 9, wherein the reference signal generator comprises:

a reference oscillator for generating a reference oscillation signal of a predetermined frequency; and a frequency divider for dividing the frequency of the reference oscillation signal by a divisor which is selected from a plurality of predetermined divisors to produce the reference signal.

11. The phase-locked loop synthesizer according to claim 8, wherein a cutoff frequency of the digital filter varies according to a selected frequency of the oscillation signal.

12. The phase-locked loop synthesizer according to claim 8, wherein a loop gain varies according to a selected frequency of the oscillation signal.

13. The phase-locked loop synthesizer according to claim 6, wherein the digital filter is implemented with wired logic.

14. The phase-locked loop synthesizer according to claim 6, wherein the digital filter is implemented with a program-controlled processor.

15. The phase-locked loop circuit according to claim 1, wherein the digital filter is a recursive filter whose multiplier coefficients are set according to the setting data.

16. The phase-locked loop synthesizer according to claim 6, wherein the digital filter is a recursive filter whose multiplier coefficients are set according to the setting data.

17. A method for selectively generating a plurality of frequencies in a phase-locked loop synthesizer, comprising the steps of:

generating a reference signal;

generating a frequency signal which varies in frequency according to a control signal, a frequency of the frequency signal being selected from the frequencies;

comparing a phase of the frequency signal to that of the reference signal to produce a phase difference signal;

converting the phase difference signal into a first digital signal;

digitally removing high-frequency components from the first digital signal according to setting data to produce a second digital signal; and converting the second digital signal into an analog signal to produce the control signal.

18. The circuit of claim 1, wherein said reference signal is fixed.

* * * * *